(12) United States Patent
Cheng et al.

(10) Patent No.: US 8,501,597 B2
(45) Date of Patent: Aug. 6, 2013

(54) METHOD FOR FABRICATING GROUP III-NITRIDE SEMICONDUCTOR

(75) Inventors: Yuh-Jen Cheng, Taipei (TW); Ming-Hua Lo, Taoyuan County (TW); Hao-Chung Kuo, Hsinchu County (TW)

(73) Assignee: Academia Sinica, Taipei (TW)

( * ) Notice: Subject to any disclaimer, the term of this patent is extended or adjusted under 35 U.S.C. 154(b) by 140 days.

(21) Appl. No.: 13/191,798

(22) Filed: Jul. 27, 2011

(65) Prior Publication Data

US 2012/0028446 A1 Feb. 2, 2012

Related U.S. Application Data

(60) Provisional application No. 61/369,480, filed on Jul. 30, 2010.

(51) Int. Cl.
| H01L 21/20 | (2006.01) |
| H01L 21/36 | (2006.01) |
| H01L 21/00 | (2006.01) |

(52) U.S. Cl.
USPC ............ 438/493; 438/492; 438/494; 438/496

(58) Field of Classification Search
USPC .............................. 438/478–509; 257/79–103
See application file for complete search history.

(56) References Cited

U.S. PATENT DOCUMENTS

| 6,265,289 | B1 * | 7/2001 | Zheleva et al. ................ 438/503 |
| 6,608,327 | B1 * | 8/2003 | Davis et al. ..................... 257/76 |
| 6,756,611 | B2 * | 6/2004 | Kiyoku et al. ................ 257/103 |
| 7,198,971 | B2 * | 4/2007 | Shin ................................ 438/44 |
| 2001/0039104 | A1 * | 11/2001 | Tsuda et al. ................... 438/496 |
| 2007/0037308 | A1 * | 2/2007 | Okuyama et al. .............. 438/46 |

* cited by examiner

*Primary Examiner* — Fernando L Toledo
*Assistant Examiner* — Karen Kusumakar
(74) *Attorney, Agent, or Firm* — Muncy, Geissler, Olds & Lowe, PLLC

(57) ABSTRACT

A method of fabricating a group III-nitride semiconductor includes the following steps of: forming a first patterned mask layer with a plurality of first openings deposited on an epitaxial substrate; epitaxially growing a group III-nitride semiconductor layer over the epitaxial substrate and covering at least part of the first patterned mask layer; etching the group III-nitride semiconductor layer to form a plurality of second openings, which are substantially at least partially aligned with the first openings; and epitaxially growing the group III-nitride semiconductor layer again.

19 Claims, 18 Drawing Sheets

METHOD FOR FABRICATING GROUP III-NITRIDE SEMICONDUCTOR

CROSS REFERENCE TO RELATED APPLICATIONS

This application claims benefit of priority to the provisional U.S. Application No. 61/369,480, filed Jul. 30, 2010, the disclosures of which are fully incorporated herein by reference.

BACKGROUND OF THE INVENTION

1. Field of Invention

The present invention relates to a method of fabricating a group III-nitride semiconductor.

2. Related Art

Group III-nitride semiconductors have been widely used in UV and blue to green light emitting diodes and short wavelength laser diode applications. They are also a very important material in high electron mobility devices. Group-III nitride is typically provided in an epitaxial film formed by an epitaxial growing process. The most popular growth method for the group III-nitride epitaxial film is by vapor-phase synthesis, for example the metal organic chemical vapor deposition (MOCVD), hydride vapor-phase epitaxy (HVPE), molecular-beam epitaxy (MBE), metal-organic chloride (MOC), and the likes. The group III-nitride film is often hetero-epitaxially grown on the substrates with different materials, such as the sapphire substrate, silicon carbide (SiC) substrate or silicon (Si) substrate, due to that the large size group III-nitride substrates are not available. The epitaxial film often has high defect density because of the mismatched lattice constants and thermal expansion coefficients between the substrate and the epitaxial film. The presence of defects of the epitaxial film can seriously affect the performance of the devices subsequently built on the substrate. Therefore, it is very desirable to reduce defect density of the epitaxial film. From application point of view, the substrate used for growing group III-nitride film may also have some undesired properties, such as the low thermal conductivity, bad electrical conductivity, or resistance for cleaving. These undesired properties seriously limit the device application and/or mass production. It is therefore desirable in some applications to remove the group III-nitride film or device from the original growth substrate for performing the following fabrication processes.

Among all group III-nitride materials, gallium nitride (GaN) is the most popular one in the semiconductor application. There are several epitaxial growth methods to improve crystal quality of the GaN film. A very commonly used one is the epitaxial lateral overgrowth technique (ELOG). Strips of the $SiO_2$ film in specific crystal orientation direction are deposited on GaN epitaxial surface, followed by epitaxially over growth. The epitaxial layer above the $SiO_2$ strips region has significantly lower the defect density. The threading dislocation defects are however still high at window regions and coalescent boundaries. The useable low defect density area is limited by the size of the patterned $SiO_2$ film area. The width of $SiO_2$ strip can not be too large. In practice, the size of the $SiO_2$ film is typically in the range of a few micro meters. Otherwise, it is difficult for epitaxially growing to fully cover the whole surface of the $SiO_2$ film.

There have been also various methods to separate the sapphire substrate from the GaN film. These methods includes the mechanical grinding method for mechanically grinding substrate away from the GaN film, the laser ablation method for using laser to lift off the GaN film from substrate (interfacial decomposition), or the chemical etching method for chemically etching away the substrate. However, the mechanical grinding method is time consuming and requires precise handling to achieve large area uniformity. The laser ablation method includes sequential processes, and only a small area can be lifted off in each process, so that it is also a time consuming process and needs an expansive UV laser apparatus. The chemical etching method, either wet or dry etching, is a difficult and slow process because the sapphire substrate is chemical relatively inert material.

Therefore, it is an important subject of the present invention to provide a method of fabricating a group III-nitride semiconductor with lower defect density.

SUMMARY OF THE INVENTION

In view of the foregoing subject, an objective of the present invention is to provide a method of fabricating a group III-nitride semiconductor that can epitaxially grow the group III-nitride semiconductor layer again for obtaining the group III-nitride semiconductor with lower defect density.

To achieve the above objective, the present invention discloses a method of fabricating a group III-nitride semiconductor. The method includes the following steps of: forming a first patterned mask layer with a plurality of first openings deposited on an epitaxial substrate; epitaxially growing a group III-nitride semiconductor layer over the epitaxial substrate and covering at least part of the first patterned mask layer; etching the group III-nitride semiconductor layer to form a plurality of second openings, which are substantially at least partially aligned with the first openings; and epitaxially growing the group III-nitride semiconductor layer again.

In one embodiment of the invention, the material of the epitaxial substrate at least includes sapphire, group III-nitride, silicon carbide (SiC), silicon (Si), gallium arsenide (GaAs), or zinc oxide (ZnO).

In one embodiment of the invention, the material of the first patterned mask layer includes $Si_3N_4$, $SiO_2$, $TiO_2$, $Ta_2O_5$, $HfO_2$, $MgO_2$, or $MgF_2$.

In one embodiment of the invention, the material of the group III-nitride semiconductor layer includes gallium nitride (GaN), aluminum nitride (AlN), indium nitride (InN), aluminum-gallium nitride (AlGaN), gallium-indium nitride (GaInN), and aluminum-indium nitride (AlInN), or indium-gallium-aluminum nitride (InGaAlN).

In one embodiment of the invention, the method further includes a step of forming a sacrificial layer on the first openings.

In one embodiment of the invention, the first patterned mask layer includes a plurality of first portions and a plurality of second portions, and each of the first portions is larger than each of the second portions.

In one embodiment of the invention, the method further includes a step of removing the first patterned mask layer.

In one embodiment of the invention, the step of etching the group III-nitride semiconductor layer to form the second openings is performed by wet etching or dry etching.

In one embodiment of the invention, the step of etching the group III-nitride semiconductor layer is completed until the group III-nitride semiconductor layer is not connected with the epitaxial substrate.

In one embodiment of the invention, after the step of epitaxially growing the group III-nitride semiconductor layer again, the group III-nitride semiconductor layer covers at least part of the second patterned mask layer.

In one embodiment of the invention, the method further includes a step of attaching a transfer-printing substrate to the group III-nitride semiconductor layer after the step of epitaxially growing the group III-nitride semiconductor layer again.

In one embodiment of the invention, the method further includes a step of forming a sacrificial layer on a plurality of the first openings. Herein, the sacrificial layer includes a group III-nitride material, which has a bandgap energy lower than that of the group III-nitride semiconductor layer. Otherwise, the sacrificial layer includes a group III-nitride material, which is easier to be etched away than the group III-nitride semiconductor layer.

In one embodiment of the invention, the method further includes a step of removing the sacrificial layer.

In one embodiment of the invention, the method further includes a step of forming a second patterned mask layer on the group III-nitride semiconductor layer.

In one embodiment of the invention, the second patterned mask layer includes a plurality of third portions and a plurality of fourth portions, and each of the third portions is larger than each of the fourth portions.

In one embodiment of the invention, the method further includes a step of removing the second patterned mask layer.

In one embodiment of the invention, after the step of epitaxially growing the group III-nitride semiconductor layer again, the group III-nitride semiconductor layer covers at least part of the second patterned mask layer.

In one embodiment of the invention, the method further includes a step of forming a third patterned mask layer on the epitaxial substrate, wherein the third patterned mask layer is disposed in the first openings.

As mentioned above, the method of fabricating a group III-nitride semiconductor according to the present invention utilizes the first patterned mask layer as a mask for controlling the position of the group III-nitride semiconductor layer growing on the epitaxial substrate. Moreover, the method of the invention further includes the step of epitaxially growing the group III-nitride semiconductor layer again after the etching step. Accordingly, the fabricated group III-nitride semiconductor has lower defect density.

BRIEF DESCRIPTION OF THE DRAWINGS

The invention will become more fully understood from the detailed description and accompanying drawings, which are given for illustration only, and thus are not limitative of the present invention, and wherein:

FIG. 8I is a flow chart of the method of fabricating a group III-nitride semiconductor according to the sixth embodiment of the invention.

DETAILED DESCRIPTION OF THE INVENTION

The present invention will be apparent from the following detailed description, which proceeds with reference to the accompanying drawings, wherein the same references relate to the same elements.

Figure 1:
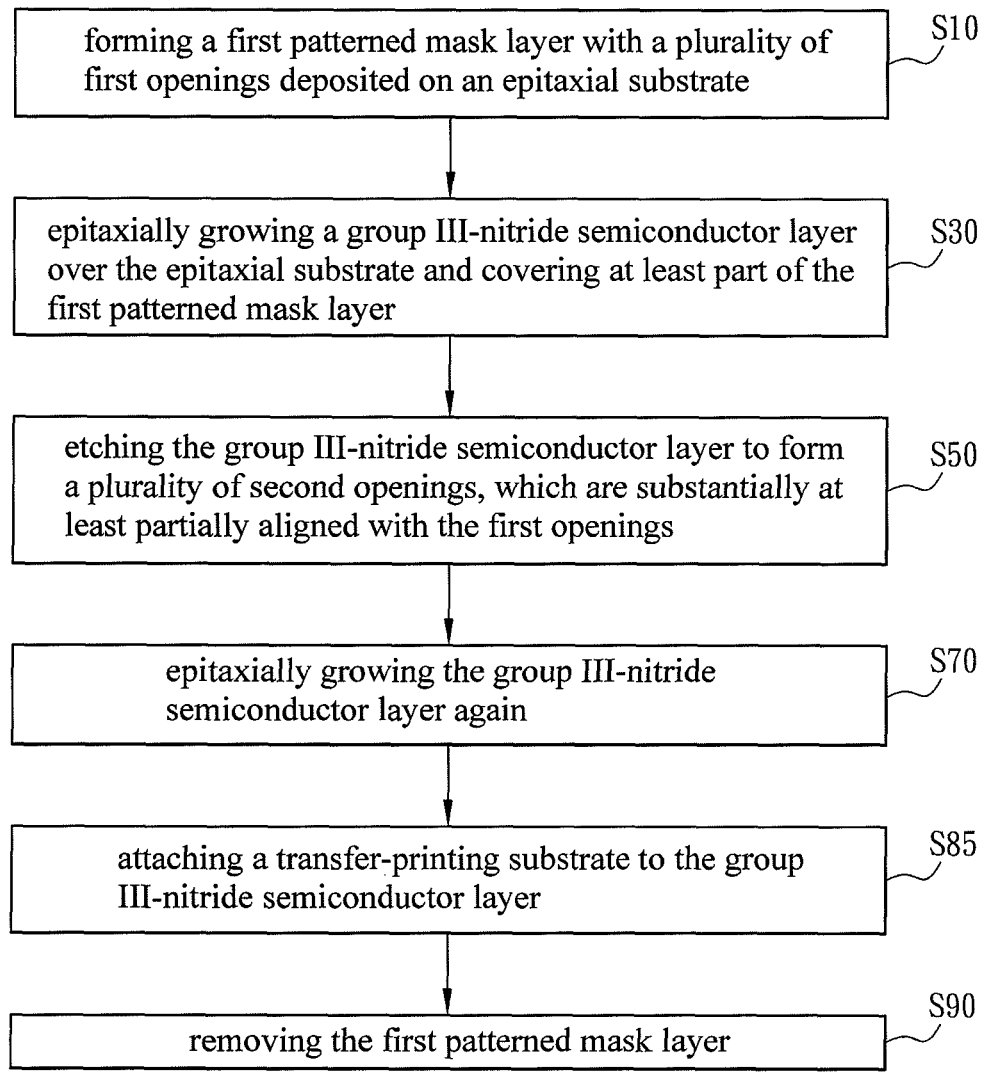
FIG. 1 is a flow chart of a method of fabricating a group III-nitride semiconductor according to a first embodiment of the invention.

FIG. 1 is a flow chart of a method of fabricating a group III-nitride semiconductor according to a first embodiment of the invention. As shown in FIG. 1, the method of fabricating a group III-nitride semiconductor of the first embodiment includes the following steps of: forming a first patterned mask layer with a plurality of first openings deposited on an epitaxial substrate (step S10); epitaxially growing a group III-nitride semiconductor layer over the epitaxial substrate and covering at least part of the first patterned mask layer (step S30); etching the group III-nitride semiconductor layer to form a plurality of second openings, which are substantially at least partially aligned with the first openings (step S50); and epitaxially growing the group III-nitride semiconductor layer again (step S70).

Although the following description and representative examples describe methods of fabricating GaN semiconductors, the scope of the present invention is not limited to these. Other group-III nitride semiconductors, such as binary compounds (e.g. gallium nitride (GaN), aluminum nitride (AlN), and indium nitride (InN)), ternary compounds (e.g. aluminum-gallium nitride (AlGaN), gallium-indium nitride (GaInN), and aluminum-indium-nitride (AlInN)), and quaternary compounds (e.g. indium-gallium-aluminum nitride (InGaAlN)) also fall within the scope of the invention.

Figure 2A:
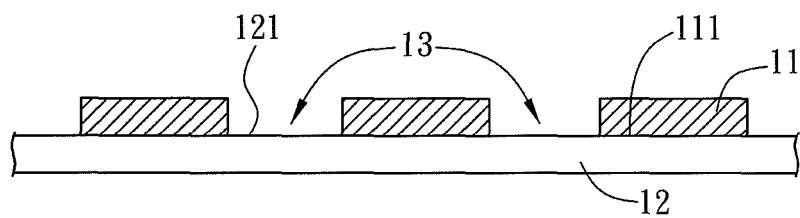
FIGS. 2A to 2F are schematic diagrams showing the method of fabricating a group III-nitride semiconductor according to the first embodiment of the invention.

The step S10 will be described with reference to FIG. 1 and FIG. 2A. The step S10 is to dispose a material of the mask layer on an epitaxial substrate 12, for example, by plasma enhanced chemical vapor deposition (PECVD), and then to apply a photolithography process to the material formed on the epitaxial substrate 12 so as to form the first patterned mask layer 11. The material of the first patterned mask layer 11 may include silicon oxide (including $SiO_2$ and amorphous silicon oxide), $Si_3N_4$, $TiO_2$, $Ta_2O_5$, $HfO_2$, $MgO_2$, $MgF_2$, or amorphous materials. In addition, the material of the epitaxial substrate 12 at least includes sapphire, group III-nitride, silicon carbide (SiC), silicon (Si), gallium arsenide (GaAs), or zinc oxide (ZnO). In this embodiment, the material of the first patterned mask layer 11 includes $SiO_2$, and the epitaxial substrate 12 is a sapphire substrate for example. The first patterned mask layer 11 forms a plurality of first openings 13 on the surface 121 of the epitaxial substrate 12. The shape of the openings 13 is not limited and it can form any designed pattern. For example, the opening can be a through hole or a trench.

Figure 2B:
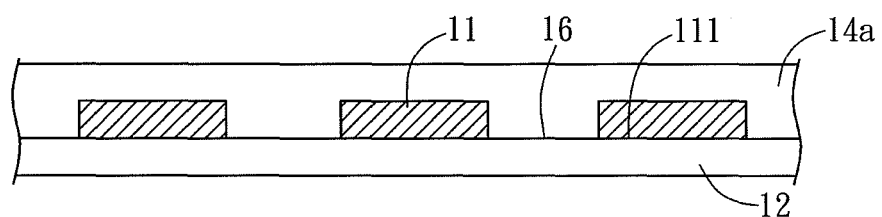

Referring to FIGS. 1 and 2B, the step S30 is to epitaxially grow a group III-nitride semiconductor layer 14a over the epitaxial substrate 12 and covering at least part of the first patterned mask layer 11. By applying proper conditions for epitaxially growing, the group III-nitride semiconductor layer 14a can be grown on the exposed surface 121 of the epitaxial substrate 12 and the first openings 13, and it does not grow on the junctions 111 covered by the first patterned mask layer 11. That is, the first patterned mask layer 11 can be used as the mask for controlling the position of the group III-nitride semiconductor layer 14a grown on the epitaxial substrate 12. In this embodiment, the group III-nitride semiconductor layer 14a is grown over the epitaxial substrate 12 and covering at least part of the first patterned mask layer 11 by the metal organic chemical vapor deposition (MOCVD). The growth of the group III-nitride semiconductor layer 14a starts from the exposed surface 121 of the epitaxial substrate 12, and it grows vertically in the first openings 13 and then grows laterally to cover the first patterned mask layer 11. Therefore, a homogeneous group III-nitride semiconductor layer 14a is formed.

Figure 2C:
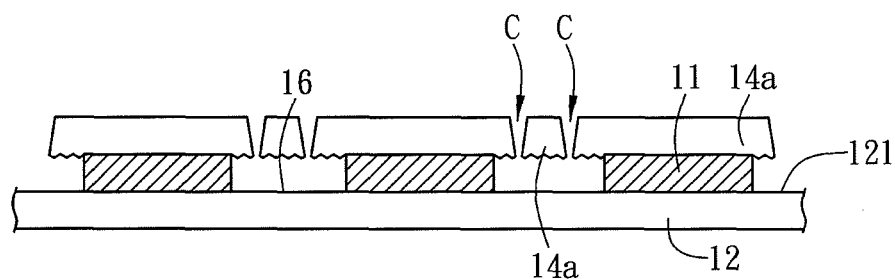

During the step S30 of epitaxially growing the group III-nitride semiconductor layer, the vertical grown portions has higher defect density than the lateral grown portions. In order to remove portions of the grown group III-nitride semiconductor layer 14a with higher defect density, the step S50 performs a defect selective etching process. In the step S50, the group III-nitride semiconductor layer 14a is immersed in wet chemicals such as aqueous or liquid phase chemicals (e.g. KOH, $H_2SO_4$, $H_3PO_4$, HCl, or combination thereof) for selectively etching the defects. Of course, it is also possible to use a dry etching process to selectively etch the group III-nitride semiconductor layer 14a so as to form the second openings C. In particular, the etch chemicals may include high concentration aqueous or liquid phase (molten) KOH solution, and the etching process may be performed at high temperature (>250° C.). The defect density is usually high at the junction 16 between the group III-nitride semiconductor layer 14a and the epitaxial substrate 12, and the threading dislocation defects propagate vertically to the top surface of the group III-nitride semiconductor layer 14a. Therefore, as shown in FIG. 2C, the defect selective etching will create a plurality of second openings C between the group III-nitride semiconductor layer 14a and the junction 16. The second openings C are substantially at least partially aligned with the first openings 13. In other words, the region of each first opening 13 includes at least one second opening C, and the group III-nitride semiconductor layer 14a with higher defect density located in the first opening 13 is almost etched away. On the contrary, the portions disposed over the first patterned mask layer 11 with lower defect density are slightly etched, so that the group III-nitride semiconductor layer 14a is almost not connected with the epitaxial substrate 12. To be noted, the second openings C can be through holes or trenches.

Figure 2D:
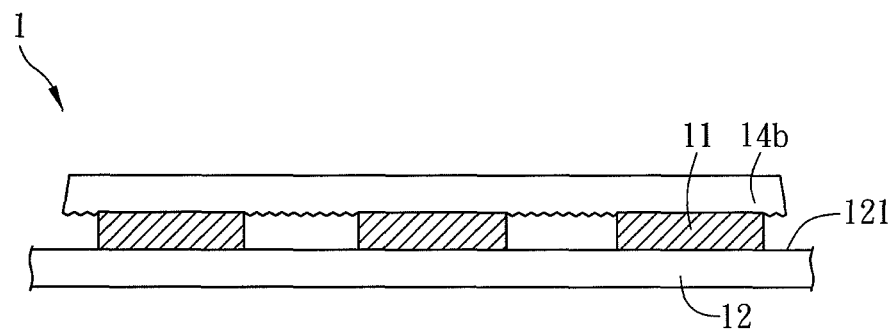

As shown in FIG. 2D, in the step S70, the epitaxial substrate 12 is subsequently put back to MOCVD for epitaxially growing again so as to form a group III-nitride semiconductor layer 14b. The growth parameters are tuned to promote lateral growth to fill up the second openings C created by defect selective etching and to planarize the etched surface. Accordingly, the desired wafer structure 1 is fabricated. To be noted, if the group III-nitride semiconductor layer 14a formed in the step S30 does not coalesce and does not fully cover the first patterned mask layer 11, some gaps may be left. These gaps can be filled up in the following second lateral growth process (step S70) as long as they are not too large. In addition, the bottom surface of the group III-nitride semiconductor layer 14b (facing the epitaxial substrate 12) may not be a planar surface, but it can has a good light extraction ability when the group III-nitride semiconductor layer 14b is applied as an LED substrate. Besides, the thickness or shape of the group III-nitride semiconductor layer 14b is depended on the application of the end product, and it is not limited in this embodiment.

Figure 2E:
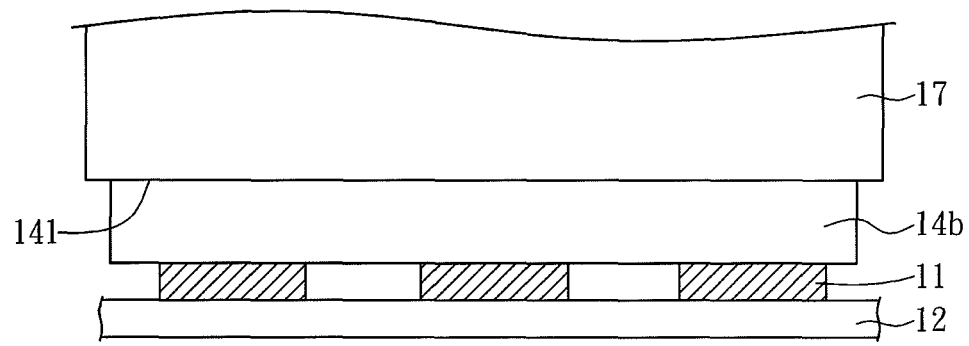
Figure 2F:
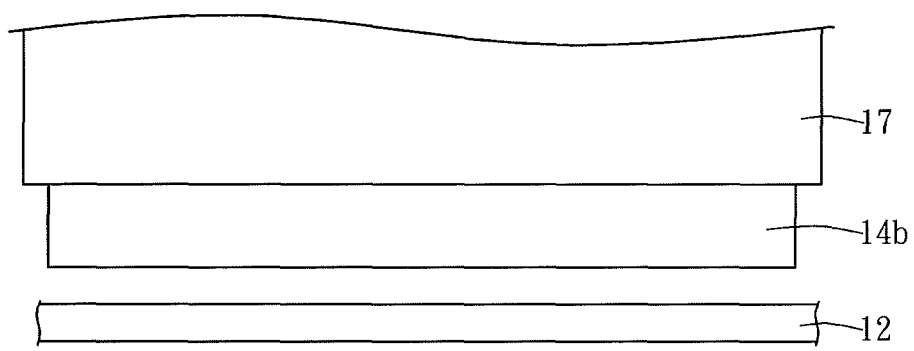

The method of fabricating a group III-nitride semiconductor of this embodiment further includes the steps of: attaching a transfer-printing substrate to the group III-nitride semiconductor layer after the step of epitaxially growing the group III-nitride semiconductor layer again (step S85); and removing the first patterned mask layer (step S90). Before removing the first patterned mask layer 11, the group III-nitride semiconductor layer 14b grown in the step S85 is thinner. As shown in FIG. 2E and FIG. 2F, for a better handling and/or for better device performance, a transfer-printing substrate 17 can be bonded to the top surface 141 of the group III-nitride semiconductor layer 14b, followed by wet etching of the first patterned mask layer 11 to remove it away from the epitaxial substrate 12. This process transfers the group III-nitride semiconductor layer 14b from the epitaxial substrate 12 to the transfer substrate 17 that is better suited for final device application. In this case, the transfer substrate 17 can be made of heat conductive materials, such as silicon or metal, for dissipating heat from the device.

Figure 3:
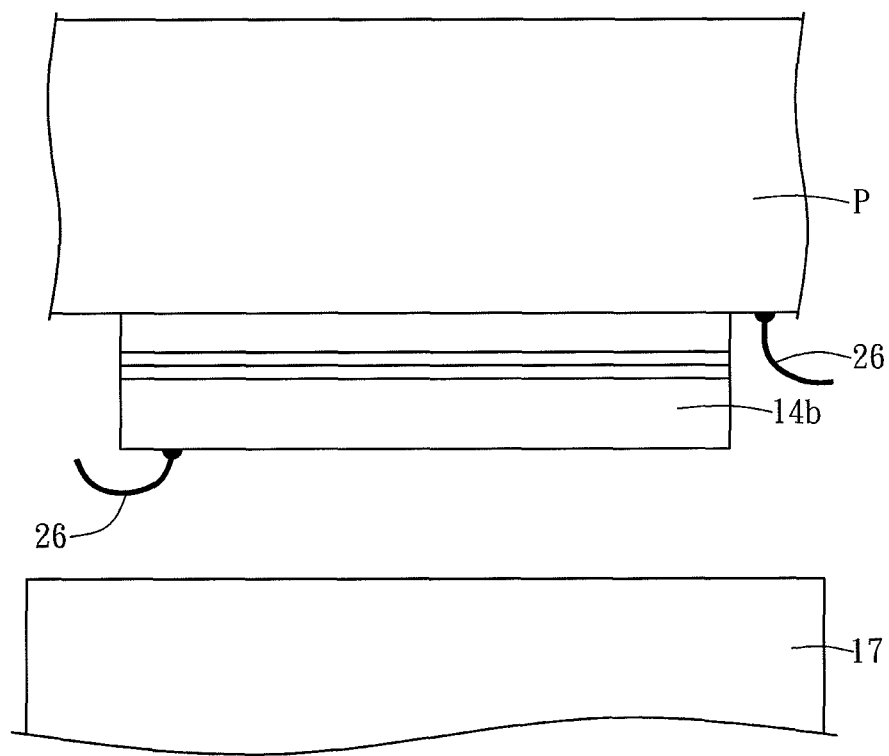
FIG. 3 is a schematic diagram showing an LED device, which includes a group III-nitride semiconductor layer fabricated according to the method of the invention.

In the following processes, a desired device structure, such as a laser diode or the light emitting layer of a light-emitting diode, can be grown or formed on the group III-nitride semiconductor layer 14b. As shown in FIG. 3, the above mentioned group III-nitride semiconductor layer 14b is used as an LED substrate of an LED device, wherein the light emitting layer is formed on the LED substrate, and the LED die is bonded on to a printed circuit board P. After an epitaxial process for growing the light emitting layers on the group III-nitride semiconductor layer 14b, a complete LED die is bonded top side down to the printed circuit board P. To be noted, after the LED die is bonded onto the printed circuit board P, the transfer-printing substrate 17 can be removed, followed by a wire-bonding process. In the wire-bonding process, one wire 26 is bonded to a pad on the group III-nitride semiconductor layer 14b, and the other wire 26 is bonded to the printed circuit board P, which is electrically connected to the LED die. As mentioned above, the group III-nitride semiconductor layer 14b may have a non-planar surface, which can improve the light extraction efficiency of the LED die.

Figure 4A:
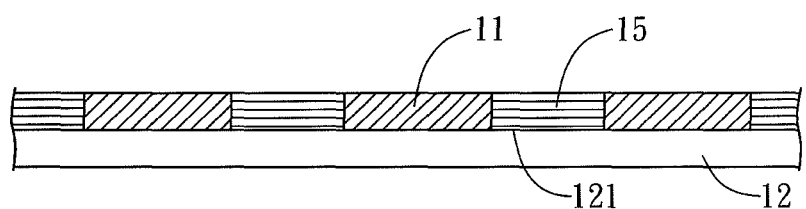
FIGS. 4A and 4B are schematic diagrams showing a method of fabricating a group III-nitride semiconductor according to a second embodiment of the invention.
Figure 4B:
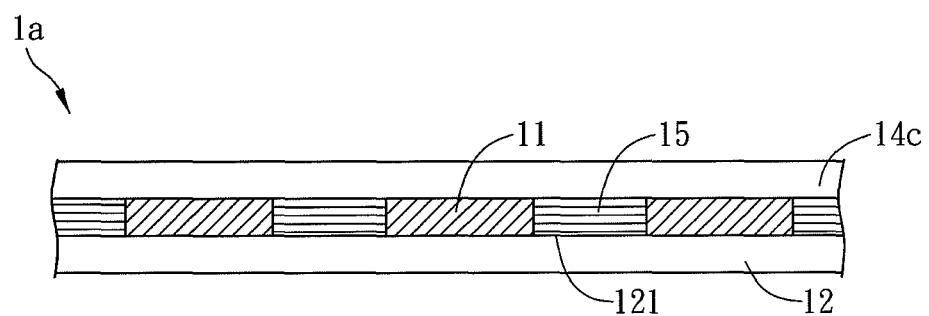
Figure 4C:
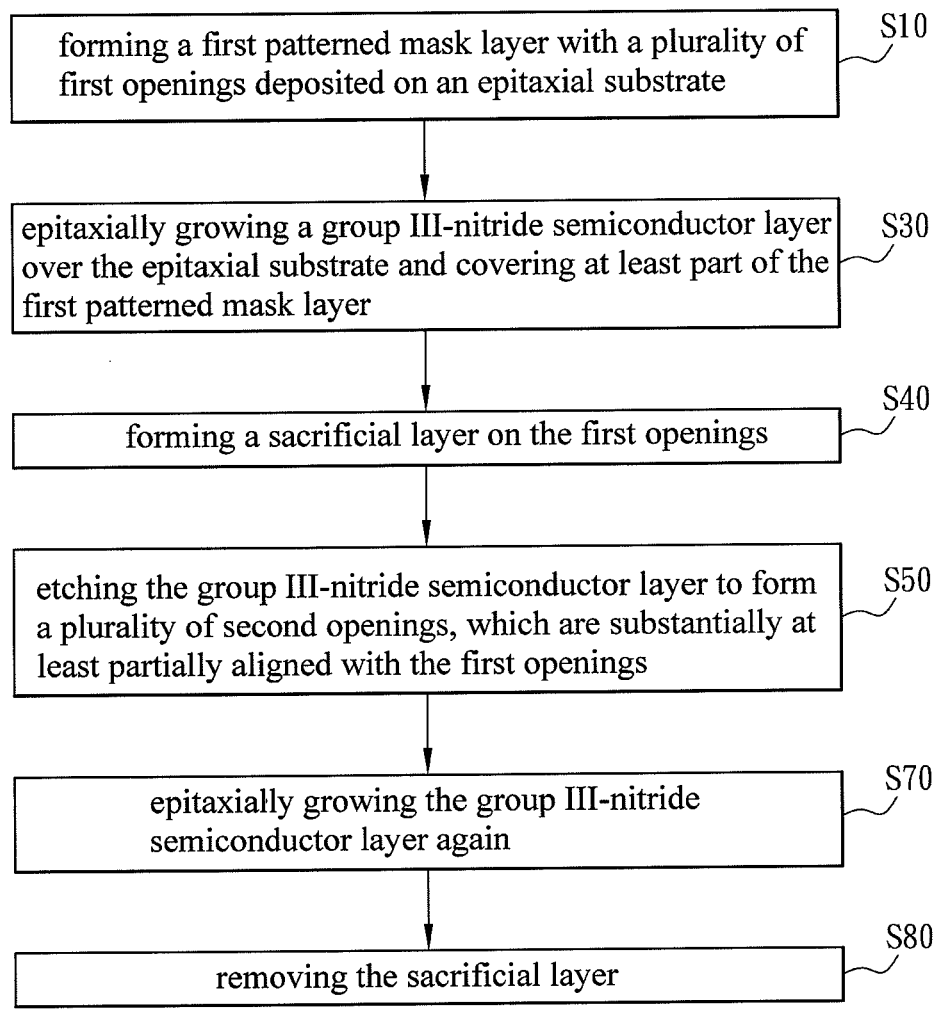
FIG. 4C is a flow chart of the method of fabricating a group III-nitride semiconductor according to the second embodiment of the invention.

FIGS. 4A and 4B are schematic diagrams showing a method of fabricating a group III-nitride semiconductor according to a second embodiment of the invention, and FIG. 4C is a flow chart of the method of fabricating a group III-nitride semiconductor according to the second embodiment of the invention. The difference between the first and second embodiments is in that the method of fabricating a group III-nitride semiconductor according to the second embodiment further includes the steps of: forming a sacrificial layer on a plurality of the first openings (step S40); and removing the sacrificial layer (step S80). In the step S40, a sacrificial layer 15 is formed on the first openings 13 after the first patterned mask layer 11 is formed on the epitaxial substrate 12. Of course, the sacrificial layer 15 may be formed before the formation of the first patterned mask layer 11. Then, a group III-nitride semiconductor layer 14c is epitaxially grown on the first patterned mask layer 11 and the sacrificial layer 15. Herein, the material of the sacrificial layer 15 may be another group III-nitride material, which is different from the material of the group III-nitride semiconductor layer. In this embodiment, the material of the sacrificial layer 15 is, for example, InGaN that is suitable for the following bandgap selectivity etching process. The sacrificial layer 15 may have a bandgap energy lower than that of the group III-nitride semiconductor layer. Otherwise, the sacrificial layer 15 may include a group III-nitride material, which is easier to be etched away than the group III-nitride semiconductor layer. The following bandgap selectivity etching process is done by immersing the wafer structure 1a in OH ion aqueous solution, such as KOH solution, under light illumination, where the photon energy of the light is higher than the bandgap energy of the sacrificial layer 15 but lower than that of the group III-nitride semiconductor layer 14c. The light is only absorbed by the sacrificial layer 15, which enables the selective etching of the sacrificial layer 15. Thus, in the step S80, the sacrificial layer 15 can be removed by the illumination process, and the group III-nitride semiconductor layer 14c is remained. Alternatively, the different materials can incorporate with different dopants of group III-nitride. For example, the n-type doped GaN can be selectively etched away in KOH solution under UV light illumination. Choosing another material of group III-nitride having better selective etching property than the material of the grown group III-nitride semiconductor layer improves the etching controllability of the process. In particular, the sacrificial layer 15 is easier to be etched away, so that it can improve the etching controllability of the process. In this case, the sacrificial layer 15 (InGaN) can be etched away completely. After the selective etching process, the substrate structure including the first patterned mask layer 11 and the group III-nitride semiconductor layer 14b is the same as the above mentioned embodiment shown in FIG. 2D. The portion of group III-nitride semiconductor layer 14b laterally grown over the first patterned mask layer 11 will have significantly lower defect density.

Figure 5A:
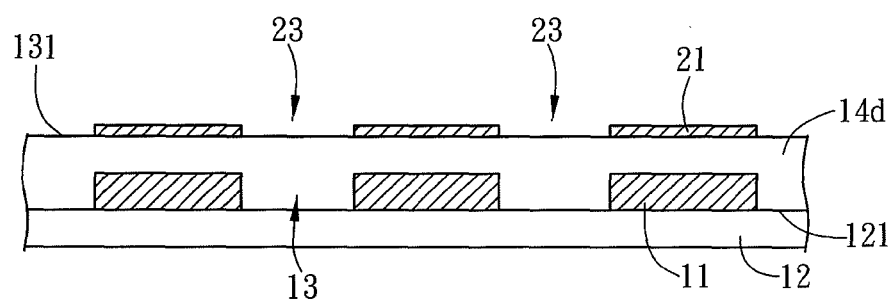
FIGS. 5A to 5E are schematic diagrams showing a method of fabricating a group III-nitride semiconductor according to a third embodiment of the invention.
Figure 5B:
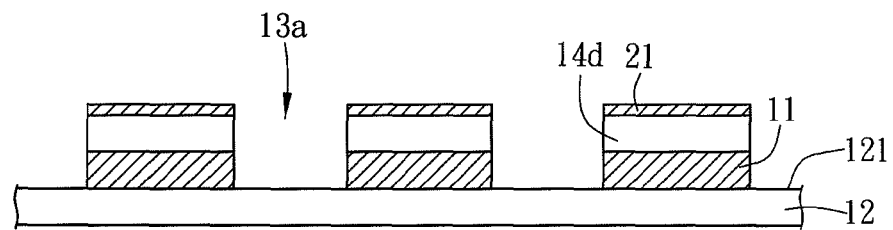
Figure 5C:
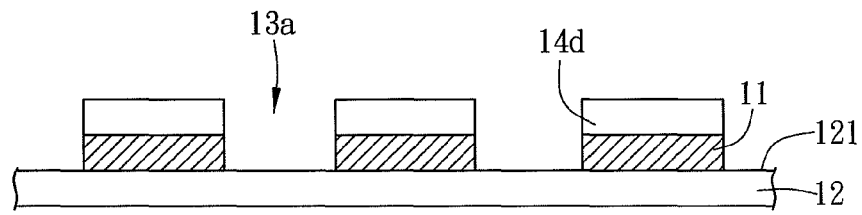
Figure 5D:
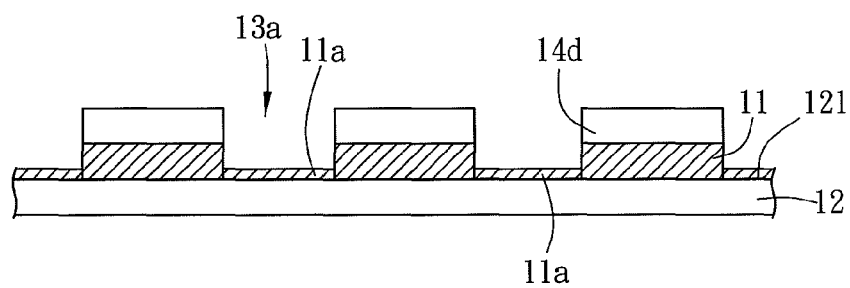
Figure 5E:
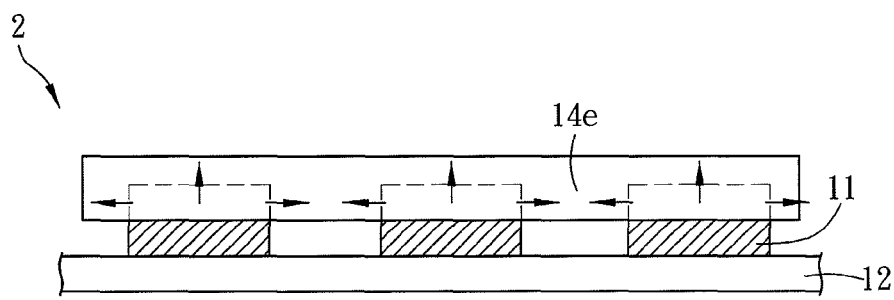
Figure 5F:
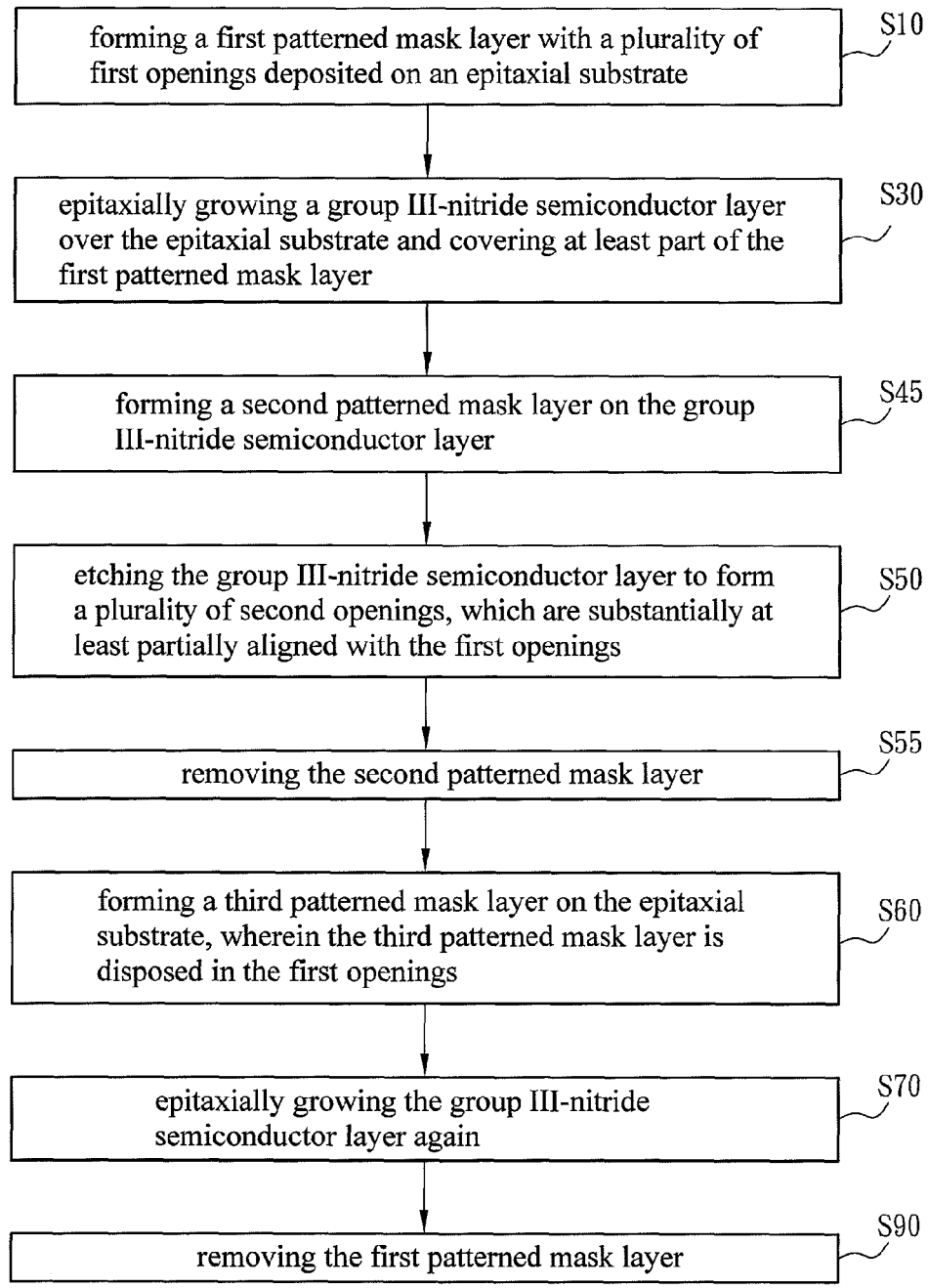
FIG. 5F is a flow chart of the method of fabricating a group III-nitride semiconductor according to the third embodiment of the invention.

FIGS. 5A to 5E are schematic diagrams showing a method of fabricating a group III-nitride semiconductor according to a third embodiment of the invention, and FIG. 5F is a flow chart of the method of fabricating a group III-nitride semiconductor according to the third embodiment of the invention. In the third embodiment of the invention, the portions of the group III-nitride semiconductor layer grown above the exposed surface of the epitaxial substrate are selectively removed. Different from the above-mentioned second embodiment, the method of fabricating a group III-nitride semiconductor according to the third embodiment further includes the following steps of: forming a second patterned mask layer on the group III-nitride semiconductor layer (step S45); removing the second patterned mask layer (step S55); and forming a third patterned mask layer on the epitaxial substrate, wherein the third patterned mask layer is disposed in the first openings (step S60).

Referring to FIGS. 5A to 5F, the step S45 is to form a first patterned mask layer 11 on the epitaxial substrate 12, epitaxially growing the group III-nitride semiconductor layer 14d, and then forming the second patterned mask layer 21. Herein, the second patterned mask layer 21 is aligned with the first patterned mask layer 11 and is located on the top surface 131 of the group III-nitride semiconductor layer 14d. The second patterned mask layer 21 includes a plurality of second openings 23, which are aligned with the first openings 13 and located above the first openings 13. As shown in FIG. 5B, the step S50 is to selectively etch portions of the group III-nitride semiconductor layer 14d exposed from the second openings 23 all the way down to the surface 121 of the epitaxial substrate 12 with using the second patterned mask layer 21 as a mask. The etching process may stop as long as the group III-nitride semiconductor layer 14d is no longer connected to the epitaxial substrate 12 and exposes the openings 13a. The etching step can be done by ICP-RIE for example. Of course, other patterned area etching methods can also be used. For example, one can use another photoresist as an etching protection mask for ICP etching. As shown in FIG. 5C, the step S55 is to etch away the second patterned mask layer 21 by ICP etching so as to remove the second patterned mask layer 21. Consequently, another MOCVD is implemented for epitaxially growing, thereby forming the group III-nitride semiconductor layer 14e as shown in FIG. 5E.

As shown in FIG. 5D, if there is a possibility that the epitaxially growth process for forming the group III-nitride semiconductor layer 14e will also grow the group III-nitride crystal on the surface 121 within the openings 13a, the group III-nitride semiconductor layer 14e may be connected with the epitaxial substrate 12, which may suffer the following separating step. To avoid the above problem, the step S60 is to deposit a third patterned mask layer 11a on the epitaxial substrate 12 as a mask for preventing the group III-nitride semiconductor layer 14e from growing on the surface 121. Of course, if the fabrication parameters are well controlled to form the group III-nitride semiconductor layer 14e without growing on the surface 121, this step S60 may be skipped. As shown in FIG. 5E, the step of epitaxially growing the group III-nitride semiconductor layer again allows the group III-nitride material to promote lateral grow to cover the openings 13a. Besides, there will be no group III-nitride crystal formed on the surface of the epitaxial substrate 12. After growing the group III-nitride semiconductor layer again, the coalesced group III-nitride semiconductor layer again 14e is form a wafer structure 2. Since the first patterned mask layer 11 of the wafer structure 2 is not connected with the epitaxial substrate 12, the consequent step is only to remove the first patterned mask layer 11 by wet etching. For example, the first patterned mask layer 11, which is made of silicon oxide, can be removed by immersing the wafer substrate 2 in BOE for wet chemical etching, thereby obtaining the desired group III-nitride semiconductor layer 14e.

To be noted, the above-mentioned transfer-printing process, which transfer the group III-nitride semiconductor layer 14e from the epitaxial substrate 12 to the above transfer-printing substrate (see FIGS. 2E and 2F), can be applied in this embodiment.

Figure 6A:
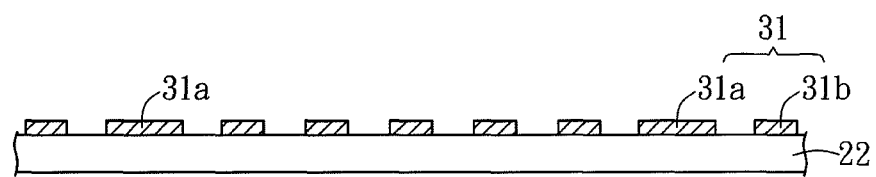
FIGS. 6A to 6C are schematic diagrams showing a method of fabricating a group III-nitride semiconductor according to a fourth embodiment of the invention.
Figure 6B:
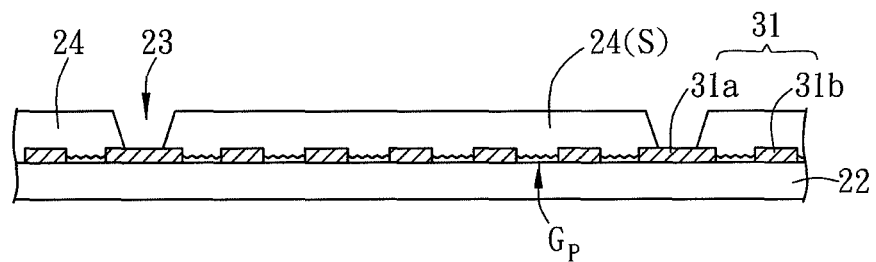
Figure 6C:
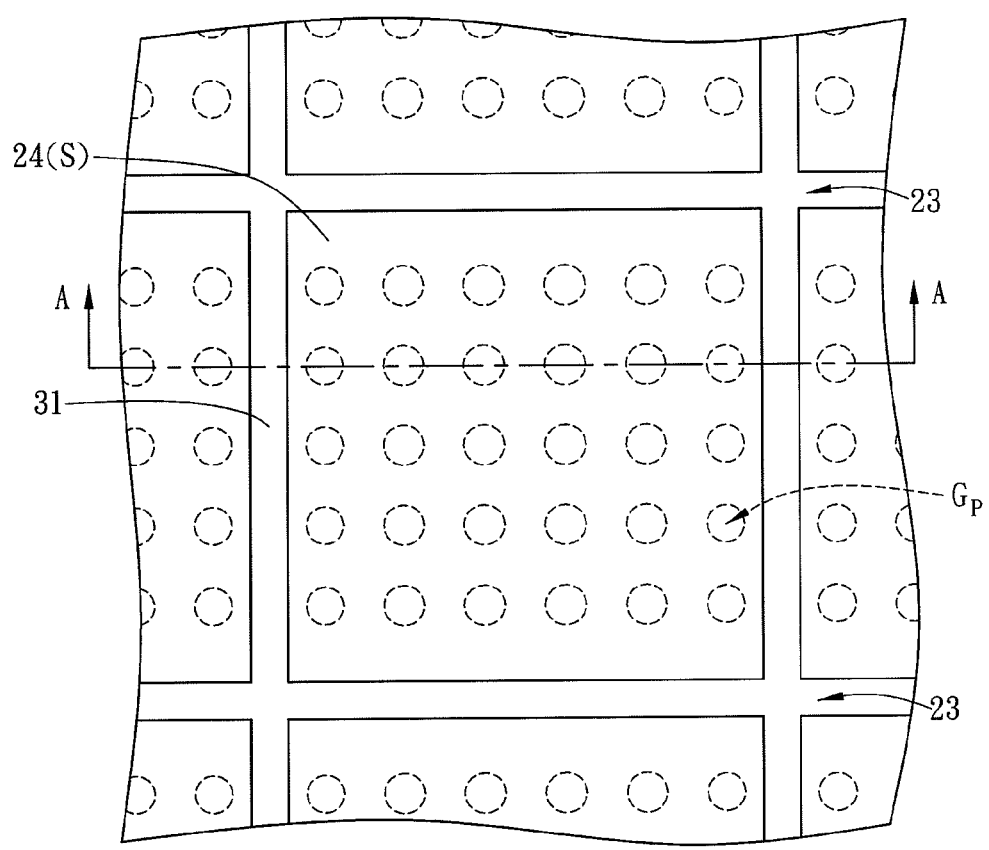

FIGS. 6A to 6C are schematic diagrams showing a method of fabricating a group III-nitride semiconductor according to a fourth embodiment of the invention, wherein FIG. 6B is a cross-sectional diagram along the line A-A of FIG. 6C. Different from the above-mentioned first embodiment, the first patterned mask layer 31 of the fourth embodiment, which is disposed on the epitaxial substrate 22, includes a plurality of first portions 31a and a plurality of second portions 31b, which have different sizes. In this embodiment, the size of the first portion 31a is larger than that of the second portion 31b, so that the lateral growth of the group III-nitride semiconductor layer 24 does not coalesce above the first portion 31a, thereby leaving openings or trenches 23 over the first portion 31a. In addition, since the second portion 31b has smaller size, so that the lateral growth of the group III-nitride semiconductor layer 24 can coalesce over the second portion 31b. Accordingly, the position of the first portion 31a with larger size can define the size and/or shape of the coalesced group III-nitride semiconductor layer 24, so that a predefined size of the group III-nitride semiconductor layer 24 can be obtained without dicing process. As shown in FIG. 6C, the dashed circles represent the gaps Gp between the group III-nitride semiconductor layer 24 and the epitaxial substrate 22. The openings or trenches 23 represent the portion where the group III-nitride regrowth is unable to coalesce, which allows the group III-nitride semiconductor layer 24 having a plurality of separated group III-nitride semiconductor substrates S. As the first patterned mask layer 31 being designed properly, any shape or size of the group III-nitride semiconductor substrates S can be pre-defined.

Figure 7A:
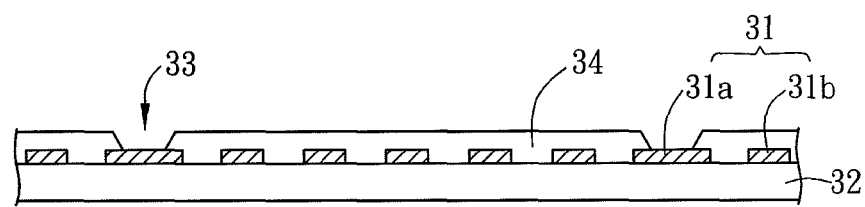
FIGS. 7A to 7E are schematic diagrams showing a method of fabricating a group III-nitride semiconductor according to a fifth embodiment of the invention.
Figure 7B:
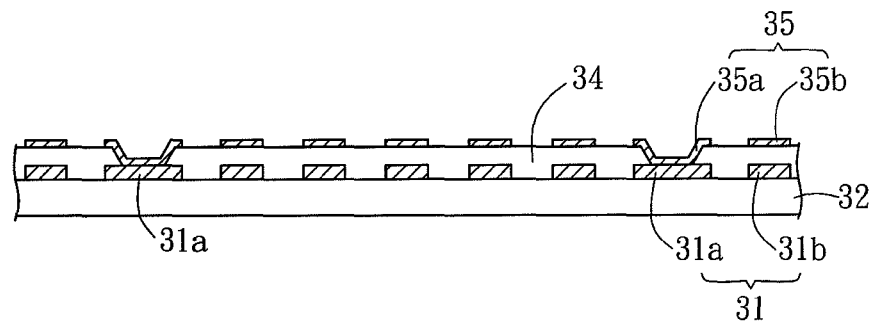
Figure 7C:
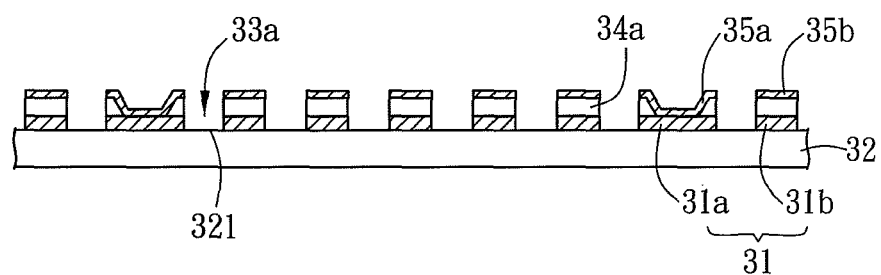
Figure 7D:
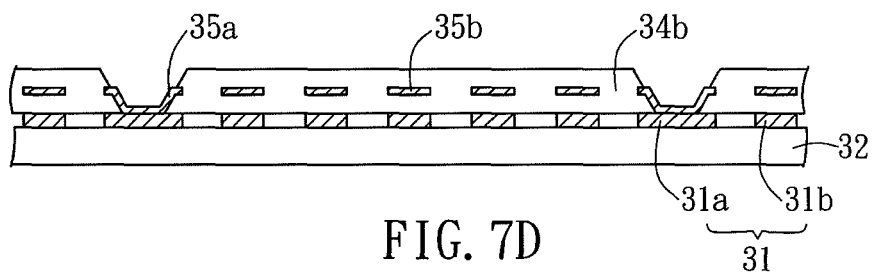
Figure 7E:
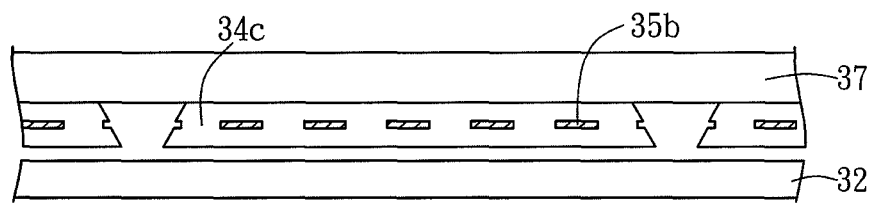
Figure 7F:
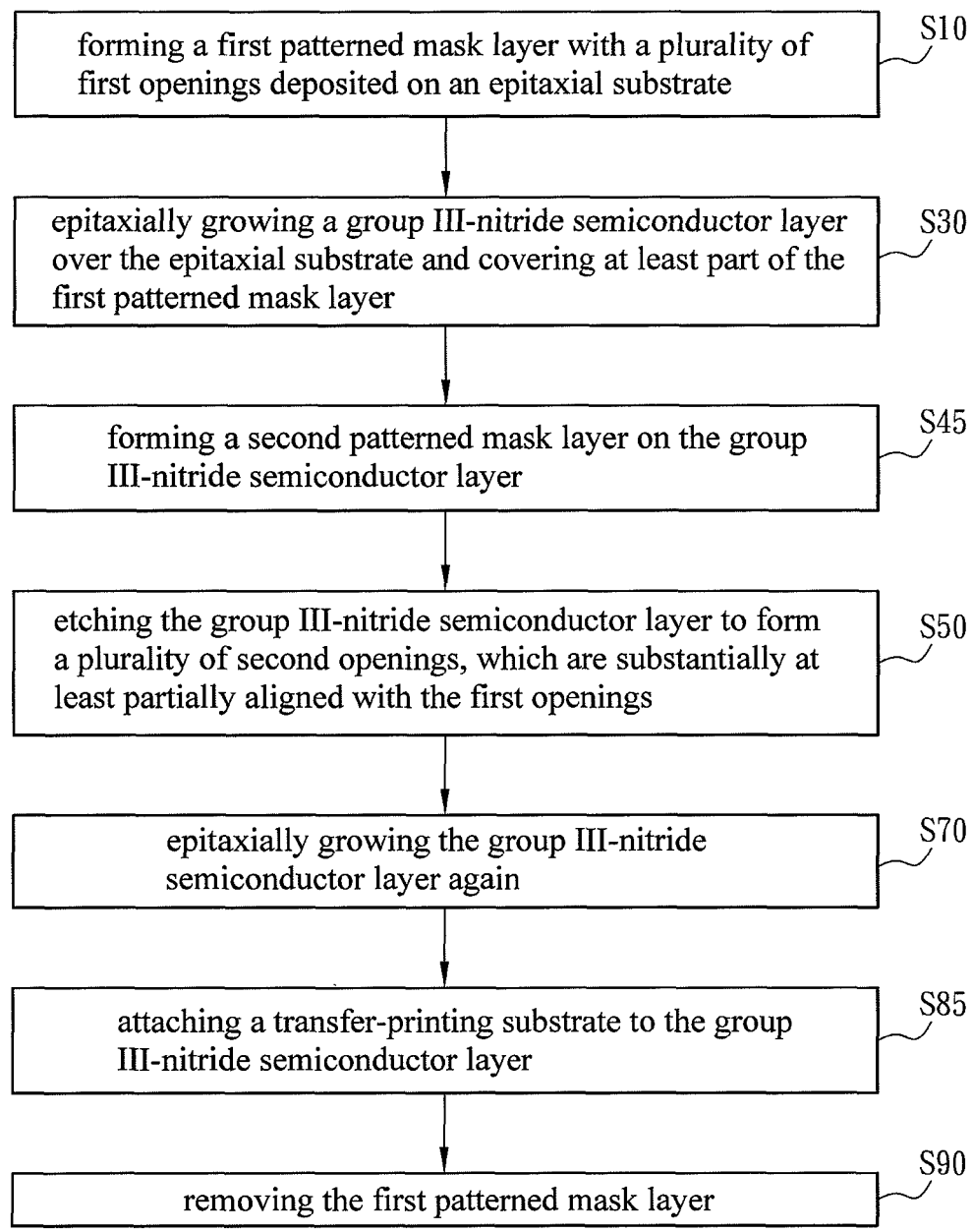
FIG. 7F is a flow chart of the method of fabricating a group III-nitride semiconductor according to the fifth embodiment of the invention.

FIGS. 7A to 7E are schematic diagrams showing a method of fabricating a group III-nitride semiconductor according to a fifth embodiment of the invention, and FIG. 7F is a flow chart of the method of fabricating a group III-nitride semiconductor according to the fifth embodiment of the invention. The fifth embodiment provides another solution for pre-defining the size and shape of the group III-nitride semiconductor. Different from the first embodiment, the step S10 of the fifth embodiment is to form the first patterned mask layer 31 including a plurality of first portions 31a and a plurality of second portions 31b with different sizes. In addition, the method of the fifth embodiment further includes a step of forming a second patterned mask layer on the group III-nitride semiconductor layer (step S45).

The group III-nitride semiconductor layer 34 is not coalescent with the first portion 31a, and it is formed not only laterally in the openings 33 but also coalescent above the second portion 31b. In this embodiment, the size of the first portion 31a is larger than that of the second portion 31b, so that the lateral growth of the group III-nitride semiconductor layer 34 does not coalesce above the first portion 31a, thereby leaving openings or trenches 33 over the first portion 31a. In addition, since the second portion 31b has smaller size, so that the lateral growth of the group III-nitride semiconductor layer 34 can coalesce over the second portion 31b. Then, the step S45 is to form the second patterned mask layer 35 with different sizes on the group III-nitride semiconductor layer 34. As shown in FIG. 7B, the second patterned mask layer 35 is deposited on the surface of the group III-nitride semiconductor layer 34 and the first portions 31a. The second patterned mask layer 35 includes a plurality of larger third portions 35a and a plurality of smaller fourth portions 35b, which are aligned with the first portions 31a and the second portions 31b.

As shown in FIG. 7C, the step S50 is to perform an etching process of the group III-nitride semiconductor with using the second patterned mask layer 35 as a mask. After the etching process, another opening 33a is revealed on the surface 321 of the epitaxial substrate 32, and the patterned group III-nitride semiconductor layer 34a is disposed between the first patterned mask layer 31 and the second patterned mask layer 35. Referring to FIG. 7D, the group III-nitride material is grown laterally and vertically to wrap some of the second patterned mask layer 35 and forms a group III-nitride semiconductor layer 34b on the first patterned mask layer 31. Since the third portions 35a is larger than the fourth portions 35b, the group III-nitride semiconductor layer 34b can wrap the fourth portions 35b but can not wrap the entire third portions 35a. In other words, the group III-nitride semiconductor layer 34b wraps only a part of the second patterned mask layer 35. Besides, an etching process can be applied to removed the second patterned mask layer 35, similar to the step S55 as shown in FIGS. 5A to 5C, before growing the group III-nitride semiconductor layer 34b. However, this embodiment does not include the step of removing the second patterned mask layer 35 as shown in FIGS. 5A to 5C. Referring to FIG. 7E, in order to separate the group III-nitride semiconductor layer 34b and the epitaxial substrate 32, the group III-nitride semiconductor layer 34b is bonded to the transfer-printing substrate 37, and then a wet etching process is performed to remove the first patterned mask layer 31 (step S90) and the larger third portions 35a of the second patterned mask layer 35. Accordingly, the group III-nitride semiconductor layer 34c with a part of the second patterned mask layer 35 wrapped therein can be obtained.

Figure 8A:
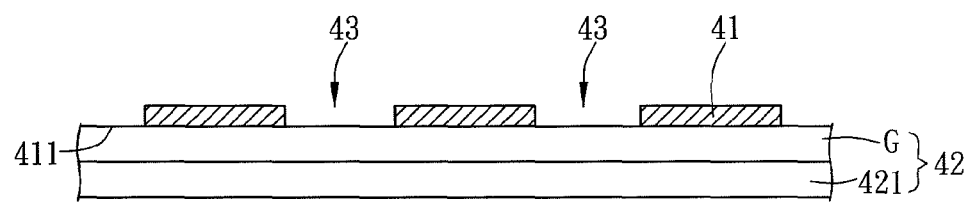
FIGS. 8A to 8H are schematic diagrams showing a method of fabricating a group III-nitride semiconductor according to a sixth embodiment of the invention.

FIGS. 8A to 8H are schematic diagrams showing a method of fabricating a group III-nitride semiconductor according to a sixth embodiment of the invention, and FIG. 8I is a flow chart of the method of fabricating a group III-nitride semiconductor according to the sixth embodiment of the invention. Different from the above-mentioned fifth embodiment, the epitaxial substrate used in the step S10 of the sixth embodiment includes multiple layers. In this embodiment, the epitaxial substrate 42 includes a GaN substrate G and a sapphire substrate 421. In addition, the method of fabricating a group III-nitride semiconductor of the sixth embodiment further includes the steps of: forming a third patterned mask layer on the epitaxial substrate, wherein the third patterned mask layer is disposed in the first openings (step S60); and removing the second patterned mask layer (step S55).

Figure 8B:
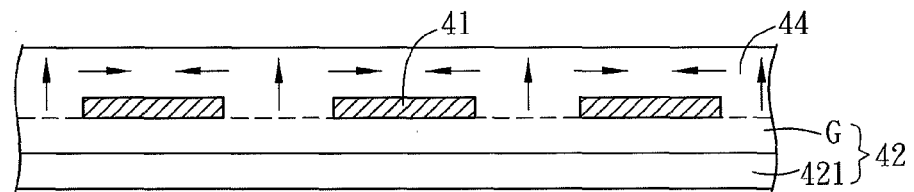
Figure 8C:
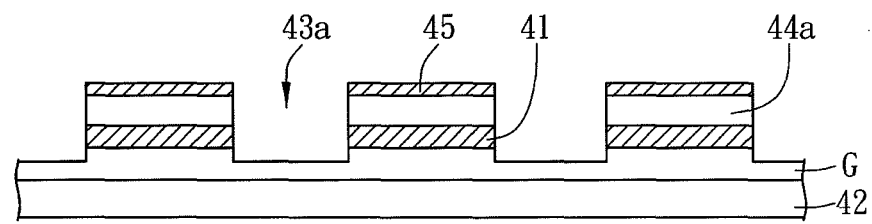

As shown in FIG. 8A, the GaN substrate G is disposed on the surface of the sapphire substrate 421, and a first patterned mask layer 41 is deposited partially on the GaN substrate G and forms a plurality of first openings 43. Herein, the GaN substrate G may be epitaxially grown on the sapphire substrate 421 or an individual substrate. As shown in FIG. 8B, through ELOG process, a group III-nitride semiconductor layer 44 is formed and covers the first patterned mask layer 41 laterally and vertically. In FIG. 8C, a second patterned mask layer 45 is disposed on the group III-nitride semiconductor layer 44a and is spatially align with the first patterned mask layer 41. An etching step (step S50) of the group III-nitride semiconductor is performed with using the second patterned mask layer 45 as a mask to remove partially the group III-nitride material, so that the grown group III-nitride semiconductor layer 44a is not connected to the original GaN substrate G. Moreover, a part of the GaN substrate G as well as a part of the group III-nitride semiconductor layer 44a is removed to form openings 43a on the GaN substrate G. In the meanwhile, the group III-nitride semiconductor layer 44a is disposed between the first patterned mask layer 41 and the second patterned mask layer 45.

Figure 8D:
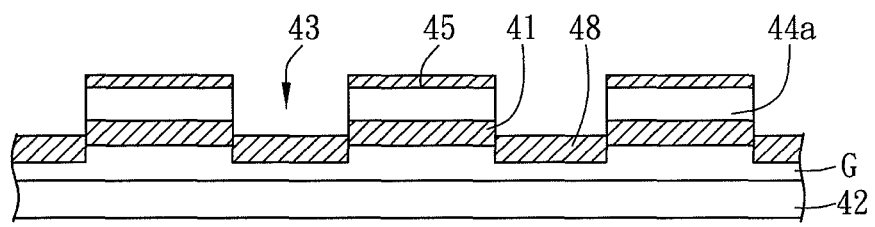
Figure 8E:
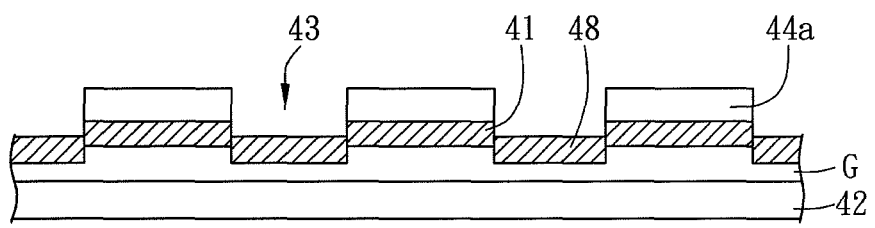
Figure 8F:
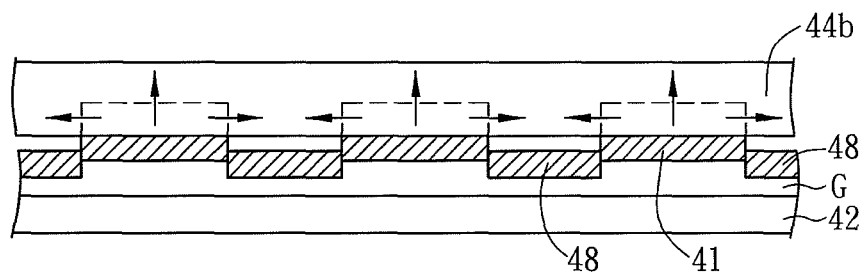
Figure 8G:
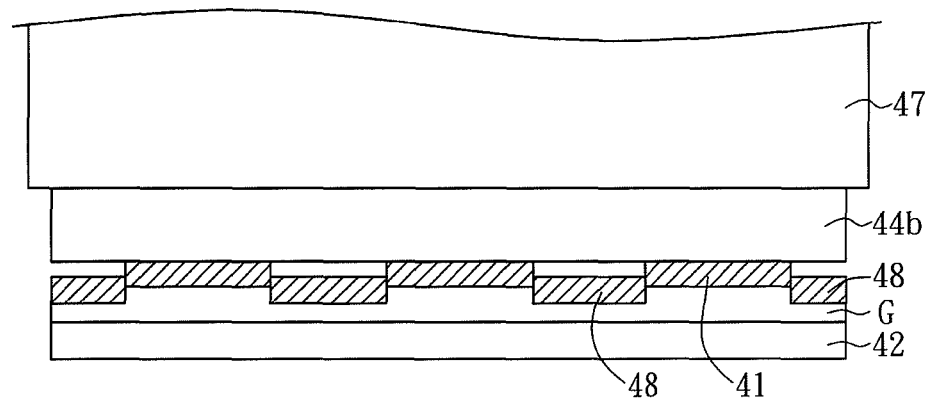
Figure 8H:
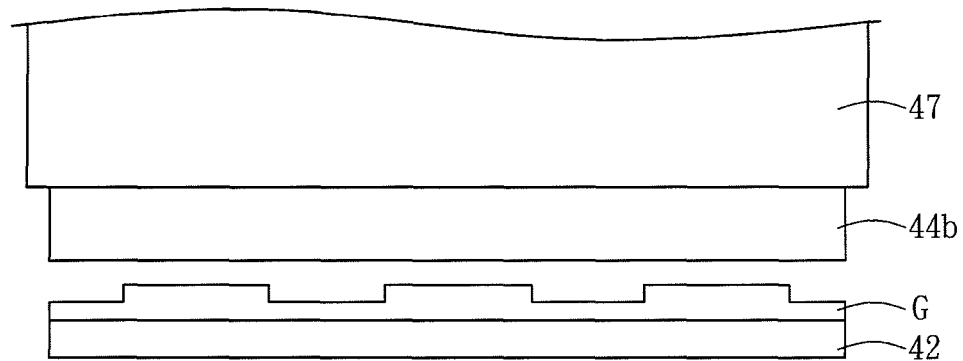
Figure 81:
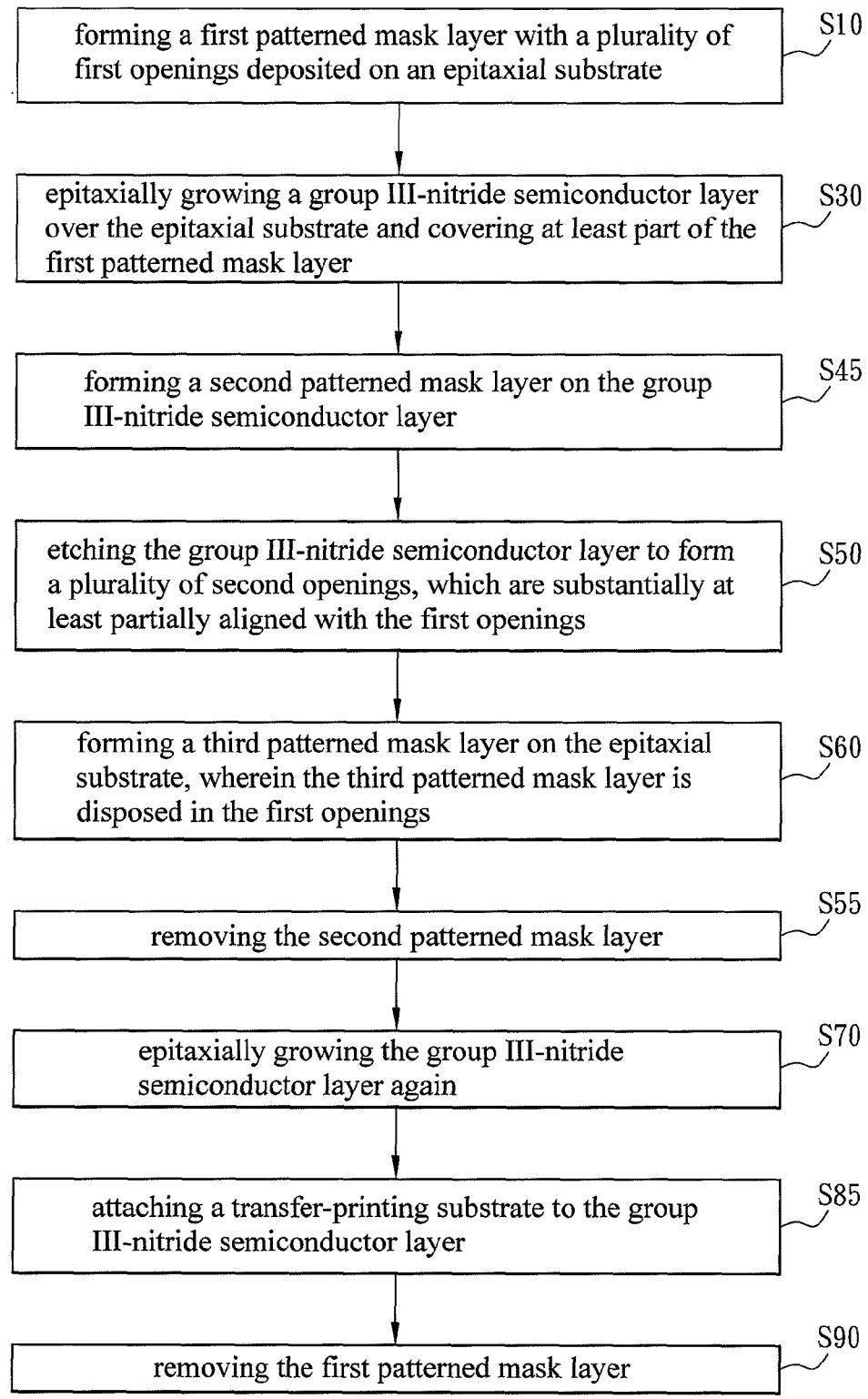

As shown in FIG. 8D, the step S60 is to form a third patterned mask layer 48 on the epitaxial substrate 42 to fill up the openings 43a. Next, in FIG. 8E, the second patterned mask layer 45 is removed by ICP etching to expose the patterned group III-nitride semiconductor layer 44a. In FIG. 8F, another epitaxially growing process is performed to from a group III-nitride semiconductor layer 44b laterally and vertically standing on the first patterned mask layer 41. The third patterned mask layer 48 filled in the openings 43a prevents the group III-nitride semiconductor layer 44b from bonding with the GaN substrate G. Then, referring to FIGS. 8G and 8H, a transfer-printing substrate 47 is bonded to the group III-nitride semiconductor layer 44b, and a wet etching process is performed to remove all the first patterned mask layer 41 and the third patterned mask layer 48, thereby transferring the group III-nitride semiconductor layer 44b to the transfer-printing substrate 47. The group III-nitride semiconductor layer 44b attached to the transfer-printing substrate 47 is better for handling in various group III-nitride applications. To be noted, the order of the steps S55 and S60 can be changed. For example, the step S55 may be performed before the step S60. In addition, the GaN substrate G separated from the group III-nitride semiconductor layer 44b can be reused at next fabricating processes, which can reduce the material cost.

In summary, the method of fabricating a group III-nitride semiconductor according to the present invention utilizes the first patterned mask layer as a mask for controlling the position of the group III-nitride semiconductor layer growing on the epitaxial substrate. Moreover, the method of the invention further includes the step of epitaxially growing the group III-nitride semiconductor layer again after the etching step. Accordingly, the fabricated group III-nitride semiconductor has lower defect density.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of fabricating a group III-nitride semiconductor, comprising the steps of:
    forming a first patterned mask layer with a plurality of first openings deposited on an epitaxial substrate;
    epitaxially growing a group III-nitride semiconductor layer over the epitaxial substrate and covering at least part of the first patterned mask layer;
    etching the group III-nitride semiconductor layer to form a plurality of second openings, wherein the second openings are substantially at least partially aligned with the first openings; and
    epitaxially growing the group III-nitride semiconductor layer again.

2. The method according to claim 1, wherein the material of the epitaxial substrate at least comprises sapphire, group III-nitride, silicon carbide (SiC), silicon (Si), gallium arsenide (GaAs), or zinc oxide (ZnO).

3. The method according to claim 1, wherein the material of the first patterned mask layer comprises $Si_3N_4$, $SiO_2$, $TiO_2$, $Ta_2O_5$, $HfO_2$, $MgO_2$, $MgF_2$, or amorphous materials.

4. The method according to claim 1, wherein the material of the group III-nitride semiconductor layer comprises gallium nitride (GaN), aluminum nitride (AlN), indium nitride (InN), aluminum-gallium nitride (AlGaN), gallium-indium nitride (GaInN), and aluminum-indium nitride (AlInN), or indium-gallium-aluminum nitride (InGaAlN).

5. The method according to claim 1, further comprising a step of:
    forming a sacrificial layer on the first openings.

6. The method according to claim 5, wherein the sacrificial layer comprises a group III-nitride material, and the group III-nitride material has a bandgap energy lower than that of the group III-nitride semiconductor layer or is easier to be etched away than the group III-nitride semiconductor layer.

7. The method according to claim 5, further comprising a step of:
    removing the sacrificial layer.

8. The method according to claim 1, wherein the step of etching the group III-nitride semiconductor layer to form the second openings is performed by wet etching or dry etching.

9. The method according to claim 1, wherein the step of etching the group III-nitride semiconductor layer is completed until the group III-nitride semiconductor layer is not connected with the epitaxial substrate.

10. The method according to claim 1, further comprising a step of:
    attaching a transfer-printing substrate to the group III-nitride semiconductor layer after the step of epitaxially growing the group III-nitride semiconductor layer again.

11. The method according to claim 1, further comprising a step of:
    removing the first patterned mask layer.

12. The method according to claim 10, further comprising a step of removing the first patterned mask layer.

13. The method according to claim 1, wherein the first patterned mask layer comprises a plurality of first portions and a plurality of second portions, and each of the first portions is larger than each of the second portions.

14. The method according to claim 1, further comprising a step of:
    forming a second patterned mask layer on the group III-nitride semiconductor layer.

15. The method according to claim 14, further comprising a step of:
    removing the second patterned mask layer.

16. The method according to claim 14, wherein the second patterned mask layer comprises a plurality of third portions and a plurality of fourth portions, and each of the third portions is larger than each of the fourth portions.

17. The method according to claim 14, wherein after the step of epitaxially growing the group III-nitride semiconductor layer again, the group III-nitride semiconductor layer covers at least part of the second patterned mask layer.

18. The method according to claim 1, wherein after the step of epitaxially growing the group III-nitride semiconductor layer again, the group III-nitride semiconductor layer at least partially fills the second openings.

19. The method according to claim 1, further comprising a step of:
    forming a third patterned mask layer on the epitaxial substrate, wherein the third patterned mask layer is disposed in the first openings.

* * * * *